(12) United States Patent
Zare-Hoseini

(10) Patent No.: US 8,456,339 B2
(45) Date of Patent: Jun. 4, 2013

(54) DELTA SIGMA ANALOGUE TO DIGITAL CONVERTER

(75) Inventor: Hashem Zare-Hoseini, Cambridge (GB)

(73) Assignee: Cambridge Silicon Radio Limited, Cambridge, Cambridgeshire (GB)

( * ) Notice: Subject to any disclaimer, the term of this patent is extended or adjusted under 35 U.S.C. 154(b) by 114 days.

(21) Appl. No.: 12/985,068

(22) Filed: Jan. 5, 2011

(65) Prior Publication Data

US 2011/0175761 A1  Jul. 21, 2011

(30) Foreign Application Priority Data

Jan. 20, 2010  (GB) .................................. 1000857.1

(51) Int. Cl.
*H03M 3/00* (2006.01)
(52) U.S. Cl.
USPC ............................. 341/143; 341/155; 341/156
(58) Field of Classification Search
USPC .......................................... 341/143, 155, 156
See application file for complete search history.

(56) References Cited

U.S. PATENT DOCUMENTS

| 5,068,659 A | * | 11/1991 | Sakaguchi | ..................... 341/143 |
| 6,954,162 B2 | * | 10/2005 | Gupta | ........................... 341/143 |
| 2008/0062022 A1 | * | 3/2008 | Melanson | ...................... 341/143 |

* cited by examiner

*Primary Examiner* — Jean B Jeanglaude
(74) *Attorney, Agent, or Firm* — Mark J. Danielson; Pillsbury Winthrop Shaw Pittman LLP

(57) ABSTRACT

A delta sigma analogue to digital converter comprising: an integrator having first and second differential inputs for receiving an input analogue signal, the integrator having differential outputs; a quantiser having first and second differential inputs which receive signals output by the integrator, and an output which provides a digital output signal of the delta sigma analogue to digital converter, and a digital to analogue converter. The digital to analogue converter has an input which is connected to an output of the delta sigma analogue to digital converter, and first and second differential outputs. The first output of the digital to analogue converter is connected to the first input of the integrator such that if the second output of the digital to analogue converter is not connected to the second input of the integrator and the second input of the integrator is connected to a fixed reference voltage the delta sigma analogue to digital converter is able to operate in a single-ended mode.

13 Claims, 7 Drawing Sheets

DELTA SIGMA ANALOGUE TO DIGITAL CONVERTER

CROSS REFERENCE TO RELATED APPLICATIONS

This application is claiming priority to Great Britain Patent Application No. 1000857.1, filed Jan. 20, 2010, which is incorporated by reference herein in its entirety.

FIELD OF THE INVENTION

The present invention relates to a delta sigma analogue to digital converter.

BACKGROUND

As is well known to those skilled in the art, delta sigma analogue to digital converters (ADC) offer high tolerance to analogue component imperfections with high performance, reduced differential non-linearity errors, and reduce the need for complex anti-aliasing filters in comparison to other ADC implementations. For these and other reasons delta sigma ADCs have become a popular choice for low to moderate frequency, high resolution applications.

Delta sigma ADCs can be implemented either in Continuous-Time (CT) or Switched-Capacitor (SC) configurations, each having its own advantages and disadvantages which will be familiar to those skilled in the art. At the circuit level delta sigma ADCs can be realised in fully differential of single-ended variants. Fully differential variants are usually preferred, as they provide greater linearity, lower noise and better common-mode and power supply rejection properties.

In some applications it is necessary or advantageous to use a single-ended ADC, for example where the input to the ADC is a microphone or audio line in input. In such applications it is common to convert a fully differential delta sigma ADC into a single-ended delta-sigma ADC, typically by using a single-ended to differential converter (SDC) whose input receives the single-ended input, and whose differential outputs are fed to the differential inputs of a differential delta sigma ADC, as is shown in FIG. 1. This approach imposes stringent requirements on the SDC, as to avoid degrading the linearity and noise performance of the delta sigma ADC the SDC must have better linearity and noise characteristics than the delta sigma ADC.

To solve this problem the SDC can be moved inside the negative feedback loop of the delta sigma ADC, as is shown in FIG. 2. This reduces the problem of non-linearity, as the negative feedback loop of the delta sigma ADC strives constantly to make the digital output of the delta sigma ADC as close as possible to its analogue input.

However, the SDC is a high power component which increases the overall power consumption of the delta sigma ADC. Thus, this approach is not suitable for low-power applications.

A lower power alternative is illustrated in FIG. 3. In this system a differential delta sigma ADC is used in a single-ended mode with one of its inputs connected to a constant voltage reference such as ground. Although this arrangement offers reduced power consumption in comparison to the arrangements shown in FIGS. 1 and 2, it suffers from poor linearity and harmonic distortion performance, as its inputs are no longer at a virtual ground potential, which permits a signal swing to develop at these inputs. This signal swing distorts the output of the delta sigma ADC, reducing linearity and degrading harmonic distortion performance.

SUMMARY

According to a first aspect there is provided a delta sigma analogue to digital converter comprising: an integrator having first and second differential inputs for receiving an input analogue signal, the integrator having differential outputs; a quantiser having first and second differential inputs which receive signals output by the integrator, and an output which provides a digital output signal of the delta sigma analogue to digital converter; and a digital to analogue converter having an input which is connected to an output of the delta sigma analogue to digital converter, and first and second differential outputs, wherein the first output of the digital to analogue converter is connected to the first input of the integrator such that if the second output of the digital to analogue converter is not connected to the second input of the integrator and the second input of the integrator is connected to a fixed reference voltage the delta sigma analogue to digital converter is able to operate in a single-ended mode.

The delta sigma analogue to digital converter provides good linearity and harmonic distortion performance without necessitating an additional single-ended to differential converter component, thus avoiding the disadvantages of increased power consumption poor linearity associated with prior art arrangements.

The delta sigma analogue to digital converter may further comprise a switch for selectively connecting the second output of the digital to analogue converter to the second input of the integrator such that when the switch is closed the delta sigma analogue to digital converter is able to operate in a differential mode.

The delta sigma analogue to digital converter may be configured such that a loop gain of the delta sigma analogue to digital converter remains substantially constant in the differential mode and in the single-ended mode.

The gain of the digital to analogue converter may be variable according to the operating mode of the delta sigma analogue to digital converter to maintain a substantially constant loop gain of the delta sigma analogue to digital converter for both operating modes.

The delta sigma analogue to digital converter may further comprise one or more additional integrators, the or each additional integrator having first and second differential inputs for receiving an input signal and differential outputs, the differential outputs being connected to differential inputs of the adder.

The delta sigma analogue to digital converter may be a continuous time analogue to digital converter.

Alternatively, the delta sigma analogue to digital converter may be a switched capacitor analogue to digital converter.

Alternatively, the delta sigma analogue to digital converter may be a mixed mode analogue to digital converter.

The delta sigma analogue to digital converter may be implemented in a feed-forward structure.

Alternatively, the delta sigma analogue to digital converter may be implemented in a feedback structure.

The digital to analogue converter of the sigma delta analogue to digital converter may be a switched current digital to analogue converter.

Alternatively, the digital to analogue converter of the sigma delta analogue to digital converter may be a voltage mode digital to analogue converter.

According to a second aspect of the disclosure there is provided an integrated circuit comprising a delta sigma analogue to digital converter according to the first aspect of the disclosure.

BRIEF DESCRIPTION OF THE DRAWINGS

Embodiments will now be described, strictly by way of example only, with reference to the accompanying drawings, in which.

DETAILED DESCRIPTION

Figure 1:
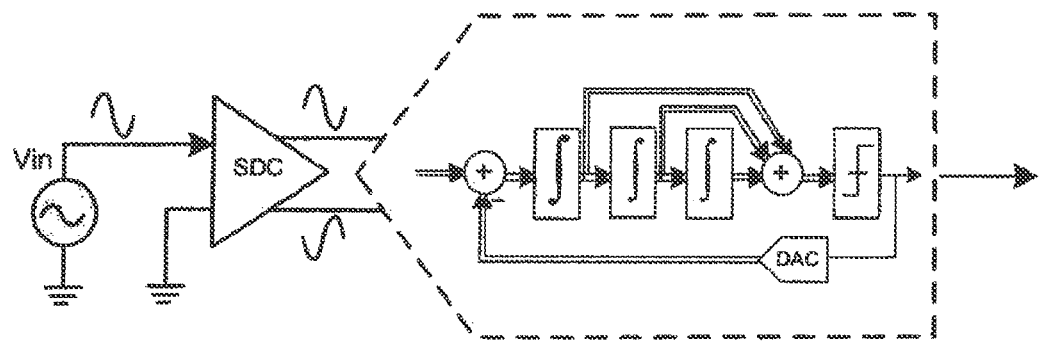
FIG. 1 is a schematic representation of a prior art delta sigma analogue to digital converter which uses a single-ended to differential converter.
Figure 2:
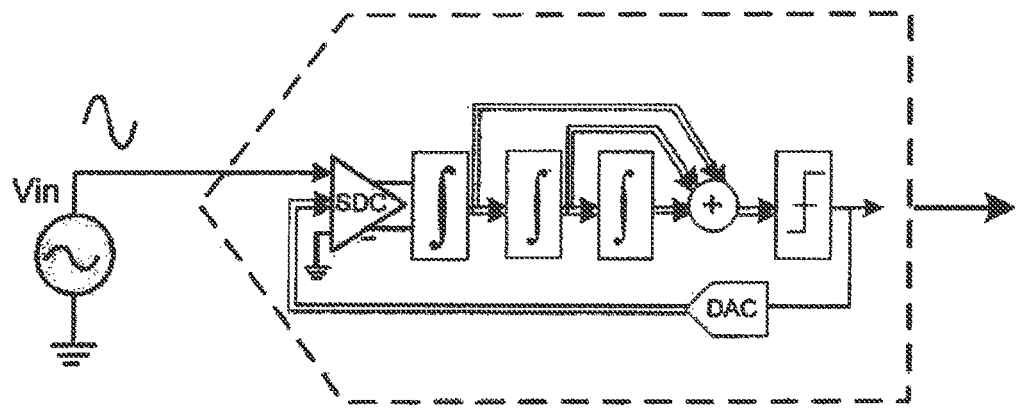
FIG. 2 is a schematic representation of a prior art delta sigma analogue to digital converter which uses a single-ended to differential converter within the feedback loop of the delta sigma analogue to digital converter.
Figure 3:
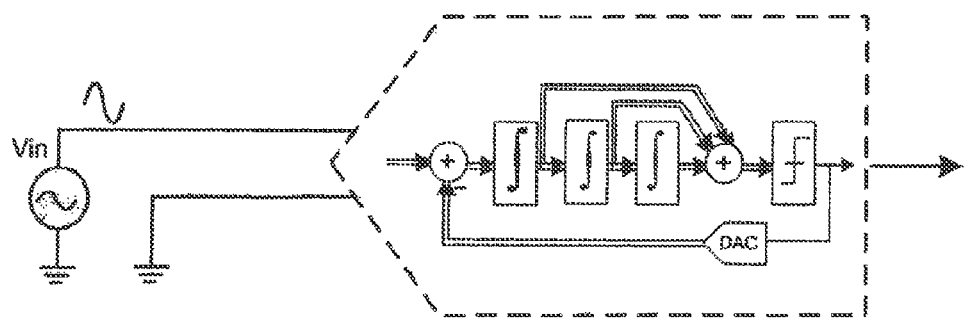
FIG. 3 is a schematic representation of a prior art differential delta sigma analogue to digital converter used in a single-ended mode by connecting one of its inputs to a fixed reference voltage.
Figure 4:
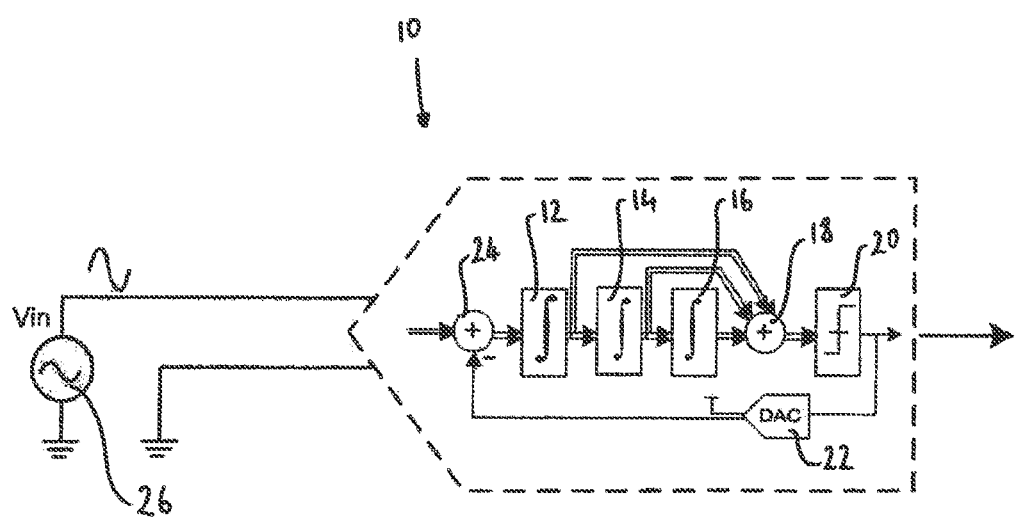
FIG. 4 is a schematic representation of a delta sigma analogue to digital converter according to an embodiment of the present disclosure.

Referring now to FIG. 4, a delta sigma analogue to digital converter (ADC) is shown generally at 10, and comprises a first integrator 12 having differential inputs and differential outputs. The differential outputs of the first integrator 12 are connected to differential inputs of a second integrator 14, which has differential outputs which are connected to differential inputs of a third integrator 16. Differential outputs of the third integrator 16 are input to differential inputs of an adder 18. The differential outputs of the first and second integrators 12, 14 are also fed to differential inputs of the adder 18. Differential outputs of the adder are connected to differential inputs of a quantiser 20, which has a single-ended output which provides an output of the ADC 10.

The output of the quantiser 10 is fed to a single-ended input of a digital to analogue converter 22 which forms part of a negative feedback loop of the ADC 10. The DAC 22 has differential outputs, one of which is fed to a negative input of an adder 24. The adder 24 has differential inputs which receive an analogue input signal to be converted to a digital signal by the ADC 10, whilst differential outputs of the adder 24 are connected to the differential inputs of the first integrator 12. A first one of the differential inputs of the adder 24 receives the analogue input signal, shown at 26 in FIG. 4. The other input of the adder 24 is connected to a fixed reference voltage, which in the example shown in FIG. 4 is ground. Thus, the ADC 10 shown in FIG. 4 is operative in a single-ended mode.

As will be appreciated by those skilled in the art, the negative feedback loop of the ADC 10, which includes the DAC 22, is operative to maintain the digital output of the quantiser 20, and thus the output of the ADC 10, as close as possible to the analogue input 26.

Figure 5:
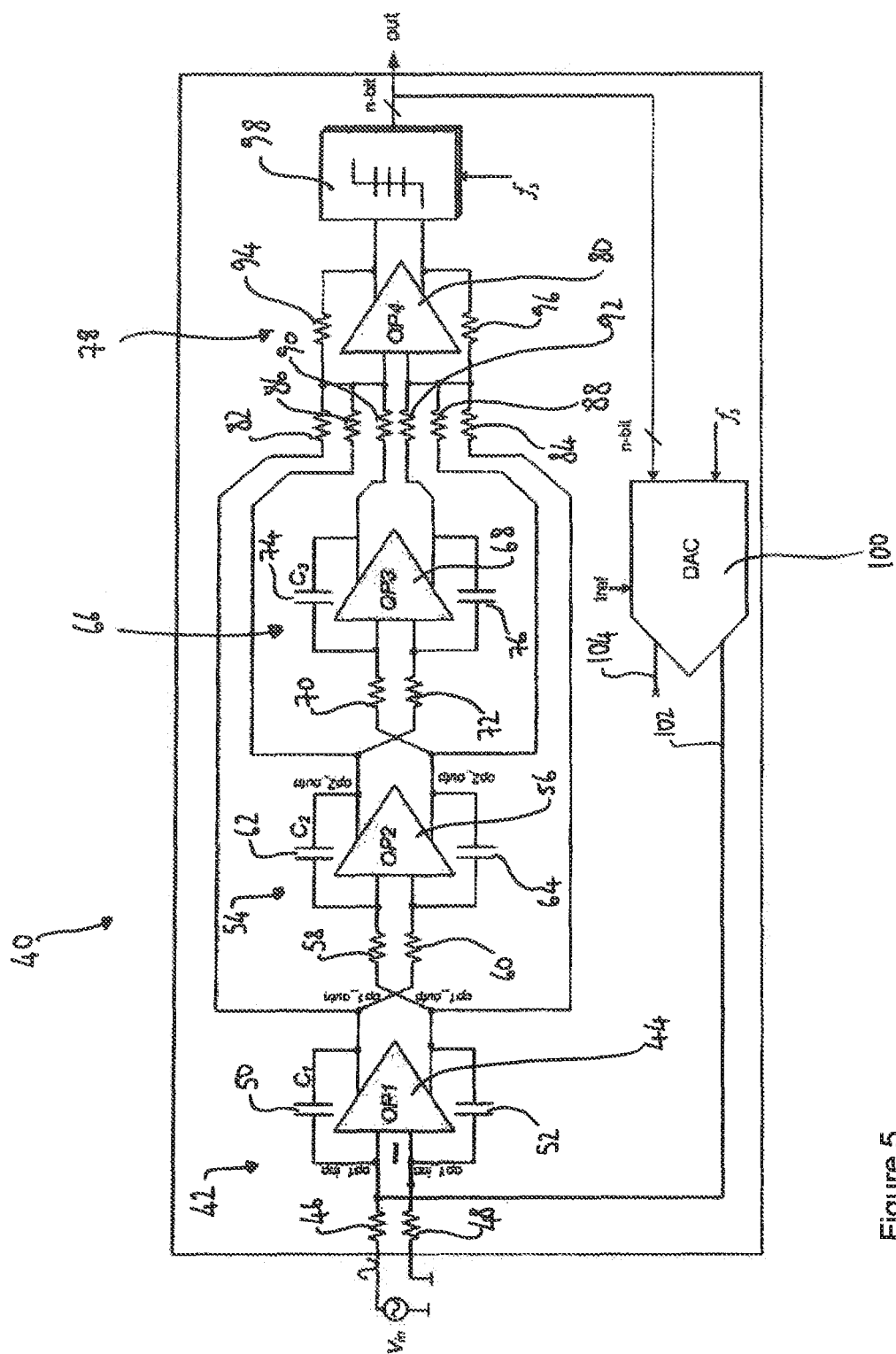
FIG. 5 is a schematic diagram showing an exemplary implementation of the delta sigma analogue to digital converter shown in FIG. 5.

FIG. 5 is a schematic diagram showing an exemplary circuit implementing the ADC shown in FIG. 4. The ADC in FIG. 5 is shown generally at 40, and comprises a first integrator 42 made up of an operational amplifier (op-amp) 44 having input resistors 46, 48 connected to its differential inputs. Feedback capacitors 50, 52 connect the output of the op-amp 44 to the respective inputs to implement the integrator functionality. The values of the input resistors 46, 48 and the feedback capacitors 50, 52 can be selected to suit the application of the ADC 40, as will be appreciated by those skilled in the art.

Differential outputs of the first integrator 42 are fed to differential inputs of a second integrator 54, which is made up of an op-amp 56 having input resistors 58, 60 connected to its differential inputs. Feedback capacitors 62, 64 connect the output of the op-amp 56 to its respective inputs to implement the integrator functionality. Again, it will be appreciated that the values of the input resistors 58, 60 and the feedback capacitors 62, 64 can be selected to suit the application of the DAC 40.

Differential outputs of the second integrator 54 are fed to differential inputs of a third integrator 66, which is made up of an op-amp 68 having input resistors 70, 72 connected to its differential inputs. Feedback capacitors 74, 76 connect the output of the op-amp 68 to its respective inputs to implement the integrator functionality. Again, it will be appreciated that the values of the input resistors 70, 72 and the feedback capacitors 74, 76 can be selected to suit the application of the DAC 40.

The outputs of the first, second and third integrators 42, 54, 66 are fed into an adder 78, which is made up of an op-amp 80 having a first pair of input resistors 82, 84, each input resistor 82, 84 being connected to a different one of the differential inputs of the op-amp 80. The input resistors 82, 84 are connected to the differential outputs of the first integrator 42. A second pair of input resistors 86, 88 is provided, each input resistor 86, 88 being connected to a different one of the differential inputs of the op-amp 80. The input resistors 86, 88 are connected to the differential outputs of the second integrator 54. A third pair of input resistors 90, 92 is provided, each input resistor 90, 92 being connected to a different one of the differential inputs of the op-amp 80. The input resistors 90, 92 are connected to the differential outputs of the second integrator 66. Feedback resistors 94, 96 connect the output of the op-amp 80 to its respective inputs to implement the adder functionality.

The output of the op-amp 80 is connected to an input of a quantiser 98, which converts the voltage output by the op-amp 80 into one of a plurality of discrete current (or voltage) values to be output by the ADC 40 as a digital signal representative of the analogue input to the ADC 40.

The output of the quantiser 98 is input into a single-ended input of a DAC 100, which converts the input signal into an output current. The DAC 100 has first and second differential outputs 102, 104, the first differential output 102 being connected to an input of the first integrator 42. The second differential output 104 of the DAC 100 is unconnected in this example, but may be connected to a fixed reference voltage such as ground.

The operation of the circuit of FIG. 5 will now be explained by reference to the circuit shown in FIG. 6. It is to be understood that the circuit of FIG. 6 is presented here to aid comprehension of the operation of the analogue to digital converter, and does not necessarily represent a practical implementation of such an analogue to digital converter.

Figure 6:
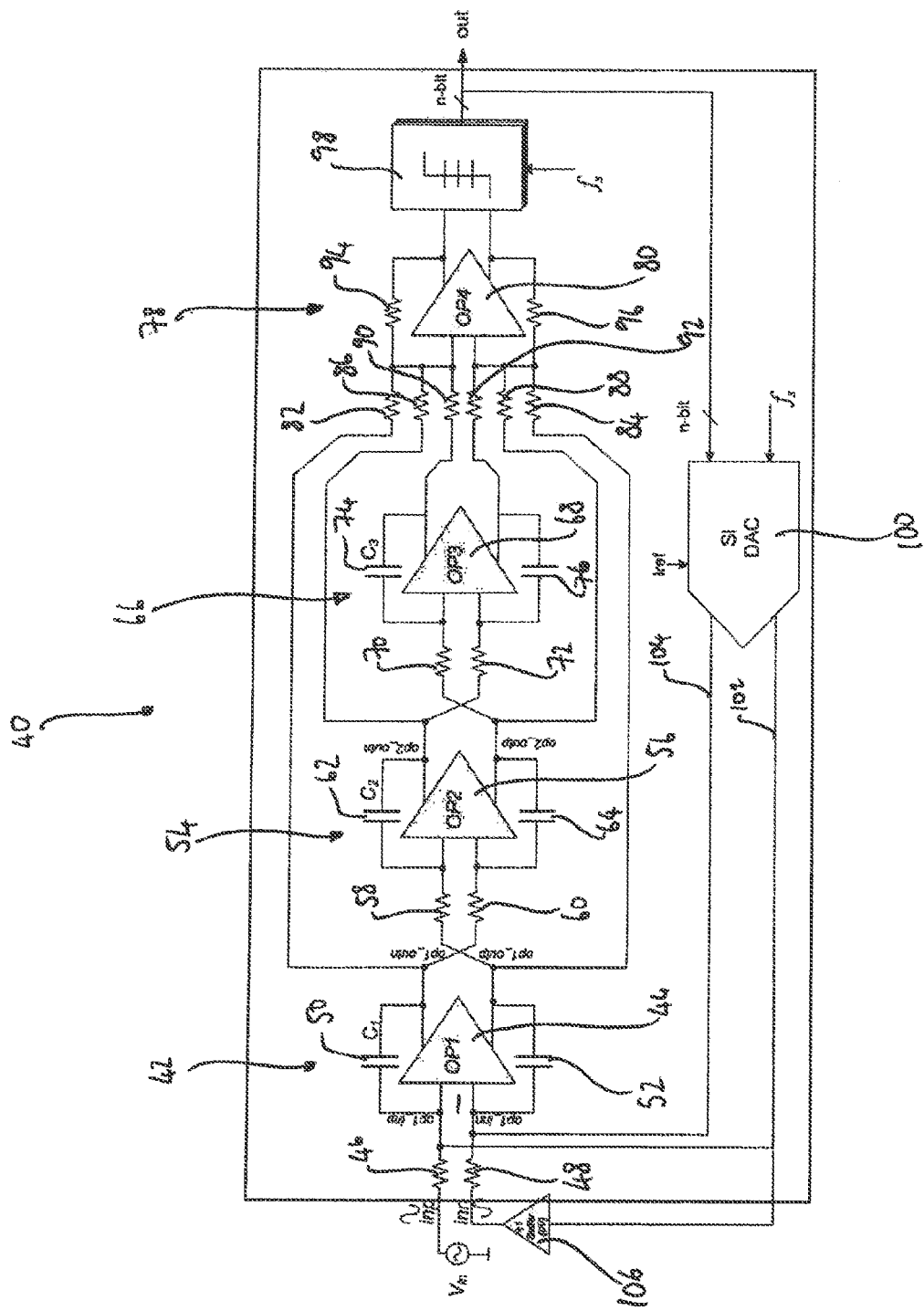
FIG. 6 is a schematic diagram for illustrating the operating principles of the delta sigma analogue to digital converters shown in FIGS. 5 and 7.

The circuit shown in FIG. 6 shares many components with that illustrated in FIG. 5, and thus the same reference numerals are used in FIG. 6 to refer to components common with the circuit of FIG. 5.

In a differential delta sigma ADC there are two differential inputs, which have a constant common mode, such that spurious signals at the inputs cancel each other out, meaning that the inputs are effectively at a virtual ground potential. However, when a differential delta sigma ADC is used in a single-ended mode by connecting one of its inputs to a fixed reference such as ground, the common mode of the inputs is no longer constant, and changes depending on ADC coefficients and the input signal amplitude, meaning that the inputs are no longer at a virtual ground potential. Thus, the operating points of the first integrator and the DAC are changed, which reduces the linearity of the ADC and increases its harmonic distortion.

In the circuit illustrated in FIG. 6 this problem is overcome by the use of a current to voltage converter or buffer 106 which has an input connected to the first output 102 of the differential DAC 100. The first output 102 of the DAC 100 is also connected to an input of the first integrator 42 of the ADC 40. The second output 104 of the DAC 100 is connected to the other input of the first integrator 42. The buffer 106 permits the first integrator 42 to receive inputs which are close to being differential inputs (note that the signal at the output of the buffer 106 is a quantised version of the analogue signal input to the ADC 40). The buffer 106 is configured to produce as its output a signal which is the negative or inverse of the signal at the second output 104 of the DAC 100. Thus, the signal output by the buffer 106 and the signal at the second output 104 of the DAC 100, which are both fed to the same input of the first integrator 42, cancel each other out, meaning that there is effectively no signal input at that input of the first integrator 42.

By appropriately selecting and configuring the components of the circuit of FIG. 5, the buffer 106 shown in FIG. 6 can be omitted such that the second output of the DAC 100 can be left unconnected and one of the inputs of the ADC 40 can be connected to a fixed reference voltage such as ground to permit the operation of the ADC 40 in a single-ended mode. In this mode, the linearity and harmonic distortion properties of the ADC are superior to those of prior art systems. Additionally, there is no signal-dependent common mode in the output of the first integrator 42, which results in lower power consumption and lower distortion.

Figure 7:
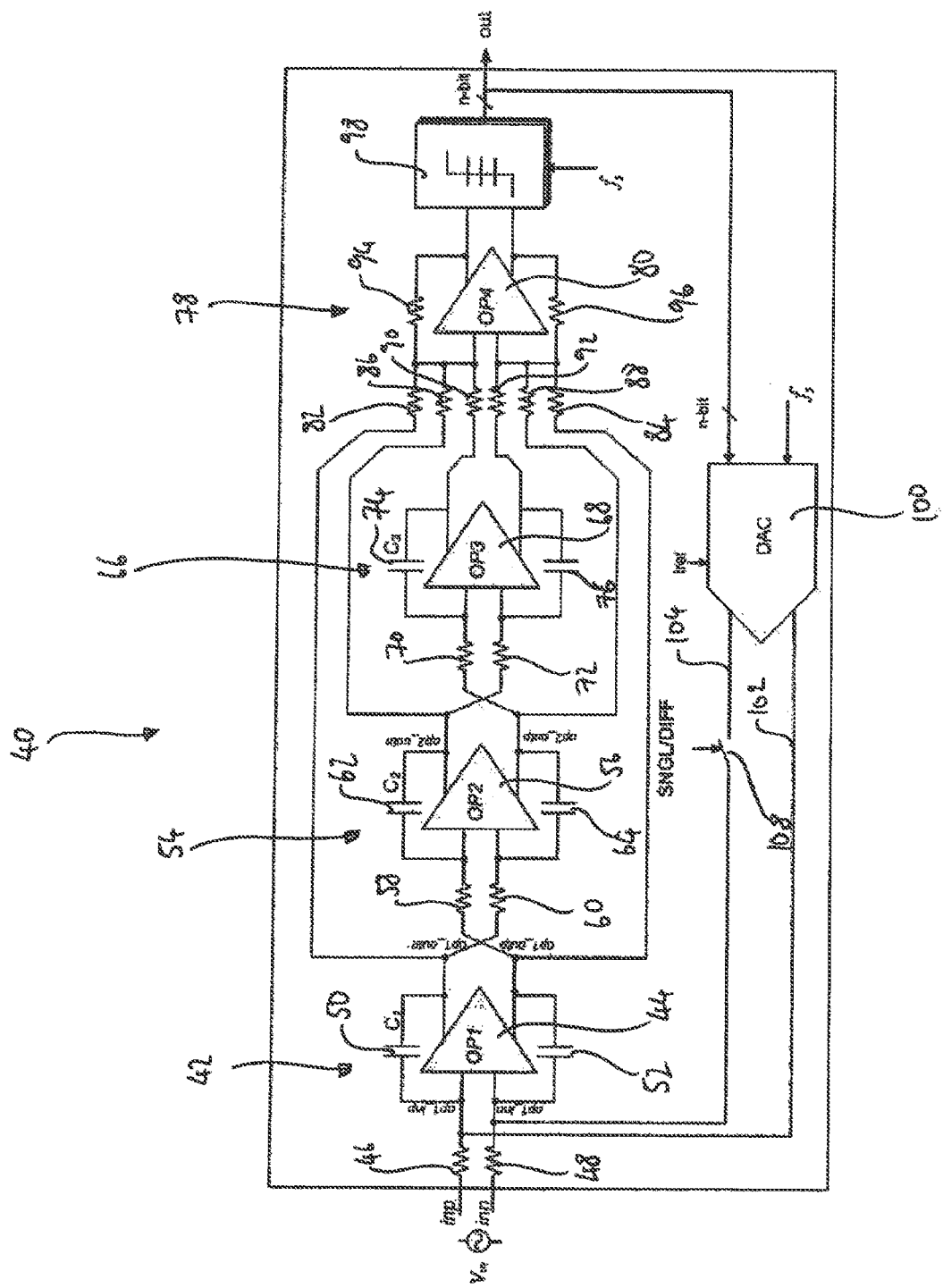
FIG. 7 is a schematic diagram showing an exemplary implementation of an alternative delta sigma analogue to digital converter shown in FIG. 5.

FIG. 7 is a schematic illustration of an alternative embodiment of a delta sigma ADC. The circuit shown in FIG. 7 uses many of the same components as that shown in FIGS. 5 and 6, and thus the same reference numerals are used in FIG. 7 to refer to components common with the circuit of FIGS. 5 and 6.

The circuit of FIG. 7 has a switch 108 which is operative selectively to connect the second output 104 of the DAC 100 to an input of the first integrator 42 of the ADC 40. Thus, the circuit of FIG. 7 can be used either in a differential mode of operation with the switch 108 closed or in a single-ended mode, with the switch 108 open.

It will be appreciated that in the single ended mode, with the switch 108 open, the loop gain of the ADC 40 is effectively halved with respect to the loop gain of the ADC when used in differential mode. To maintain stable operation of the ADC 40 in both modes it is beneficial for the loop gain to be constant for both modes. Thus, the gain of the DAC 100 in the circuit of FIG. 7 may be variable, such that when the switch 108 is opened the gain of the DAC 100 is doubled. When the switch 108 is closed, this change in the gain of the DAC is reversed, to ensure that the loop gain remains constant in both modes of operation. It will be appreciated that this is only one way of ensuring a constant loop gain in both operating modes of the ADC 40, and that others will be apparent to those skilled in the art. For example, the gain of one or more of the integrators 42, 54, 66 may be adjusted depending on the operating mode. However, adjusting the gain of the DAC 100 is advantageous because of its simplicity.

Figure 8:
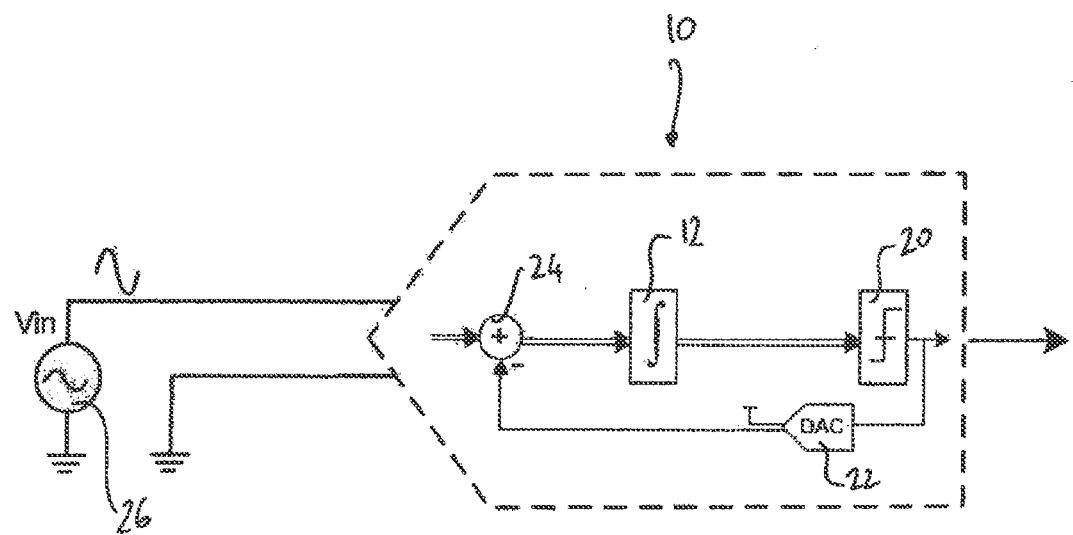
FIG. 8 is a schematic representation of an alternative implementation of a sigma delta analogue to digital converter.

The exemplary embodiments illustrated in FIGS. 4 to 7 and described above are third-order delta sigma ADCs, having three integrators. It will be appreciated, however, that alternative ADC configurations are equally suitable. The circuit illustrated schematically in FIG. 8 is a first order delta sigma ADC. This circuit shares a number of features with the circuit illustrated in FIG. 4, and thus the same reference numerals are used in FIG. 8 to refer to features which are common to both circuits.

In the circuit shown in FIG. 8 the sigma delta ADC 10 has a single integrator 12, whose differential outputs are fed directly into a quantiser 20 which provides an output of the ADC 10. The output of the quantiser 20 is also connected to an input of a differential output DAC 22. One output of the DAC 22 is connected to a negative input of an adder 24. The other output of the DAC 22 is connected to a fixed reference voltage such as ground.

The adder 24 has differential inputs which receive an analogue input signal to be converted to a digital signal by the ADC 10, whilst differential outputs of the adder 24 are connected to the differential inputs of the first integrator 12. A first one of the differential inputs of the adder 24 receives the analogue input signal, shown at 26 in FIG. 4. The other input of the adder 24 is connected to a fixed reference voltage, which in the example shown in FIG. 4 is ground. Thus, the ADC 10 shown in FIG. 4 is operative in a single-ended mode.

As well as the omission of the second and third integrators 14, 16, the circuit illustrated in FIG. 8 differs from that shown in FIG. 4 in that it does not include the adder 18. This structure can also be applied to the circuits illustrated in FIGS. 4 to 7, by removing the adders 18, 78, to implement a feedback structure in the ADC 10, 40, rather than the feed-forward structure illustrated in FIGS. 4 to 7.

Although the exemplary embodiments of a delta sigma ADC described herein and illustrated in the accompanying drawings are continuous time (CT) ADCs the present disclosure is equally applicable to switched capacitor (SC) ADCs. Additionally, the examples presented here show first and third order ADCs with, respectively, one and three integrators, but it will be appreciated that the present disclosure is not limited to these configurations, and that any number of integrators may be used in an ADC.

The delta sigma ADC 40 described herein may be implemented in a variety of ways. For example, the ADC 40 may be made up of discrete components, or may be embodied in silicon as one or more integrated circuits or parts of one or more integrated circuits, or in an appropriately-configured Field Programmable Gate Array (FPGA) or Application Specific Integrated Circuit (ASIC). Moreover, although the DAC structures shown in the Figures are switched-current (SI) mode, the delta sigma ADC 40 may have any appropriate DAC, such as a voltage mode DAC employing resistors.

The invention claimed is:

1. A single-ended delta sigma analogue to digital converter comprising:
an integrator having first and second differential inputs for receiving an input analogue signal, the integrator having differential outputs;

a quantiser having first and second differential inputs which receive signals output by the integrator, and an output which provides a digital output signal of the delta sigma analogue to digital converter; and a digital to analogue converter having an input which is connected to an output of the delta sigma analogue to digital converter, and first and second differential outputs, wherein the first output of the digital to analogue converter is connected to the first input of the integrator, the second output of the digital to analogue converter is not connected to the second input of the integrator and the second input of the integrator is configured to receive a fixed reference voltage such that the delta sigma analogue to digital converter operates in a single-ended mode.

2. A delta sigma analogue to digital converter according to claim 1 further comprising a switch for selectively connecting the second output of the digital to analogue converter to the second input of the integrator such that when the switch is closed the delta sigma analogue to digital converter is able to operate in a differential mode.

3. A delta sigma analogue to digital converter according to claim 2 wherein the delta sigma analogue to digital converter is configured such that a loop gain of the delta sigma analogue to digital converter remains substantially constant in the differential mode and in the single-ended mode.

4. A delta sigma analogue to digital converter according to claim 3 wherein the gain of the digital to analogue converter is variable according to the operating mode of the delta sigma analogue to digital converter to maintain a substantially constant loop gain of the delta sigma analogue to digital converter for both operating modes.

5. A delta sigma analogue to digital converter according to claim 1 further comprising one or more additional integrators, the or each additional integrator having first and second differential inputs for receiving an input signal and differential outputs, the differential outputs being connected to differential inputs of the adder.

6. A delta sigma analogue to digital converter according to claim 1 wherein the delta sigma analogue to digital converter is a continuous time analogue to digital converter.

7. A delta sigma analogue to digital converter according to claim 1 wherein the delta sigma analogue to digital converter is a switched capacitor analogue to digital converter.

8. A delta sigma analogue to digital converter according to claim 1 wherein the delta sigma analogue to digital converter is a mixed mode analogue to digital converter.

9. A delta sigma analogue to digital converter according to claim 1 wherein the delta sigma analogue to digital converter is implemented in a feed-forward structure.

10. A delta sigma analogue to digital converter according to claim 1 wherein the delta sigma analogue to digital converter is implemented in a feedback structure.

11. A delta sigma analogue to digital converter according to claim 1 wherein the digital to analogue converter of the sigma delta analogue to digital converter is a switched current digital to analogue converter.

12. A delta sigma analogue to digital converter according to claim 1 wherein the digital to analogue converter of the sigma delta analogue to digital converter is a voltage mode digital to analogue converter.

13. An integrated circuit comprising a delta sigma analogue to digital converter according to claim 1.

* * * * *

UNITED STATES PATENT AND TRADEMARK OFFICE
CERTIFICATE OF CORRECTION

PATENT NO. : 8,456,339 B2
APPLICATION NO. : 12/985068
DATED : June 4, 2013
INVENTOR(S) : Zare-Hoseini It is certified that error appears in the above-identified patent and that said Letters Patent is hereby corrected as shown below:

In the Specification

In Column 4, Line 24, delete "DAC 40." and insert -- ADC 40. --, therefor.

In Column 4, Line 33, delete "DAC 40." and insert -- ADC 40. --, therefor.

Signed and Sealed this
First Day of October, 2013

Teresa Stanek Rea
*Deputy Director of the United States Patent and Trademark Office*